United States Patent [19]

Reeder

[11] 4,070,638
[45] Jan. 24, 1978

[54] NONLINEAR SURFACE ACOUSTIC WAVE PSK ENCODER/CORRELATOR

[75] Inventor: Thomas Macklin Reeder, Glastonbury, Conn.

[73] Assignee: United Technologies Corporation, Hartford, Conn.

[21] Appl. No.: 676,836

[22] Filed: Apr. 14, 1976

[51] Int. Cl.² .................... H03H 7/28; H03H 9/26; H03H 9/02; H03H 9/32
[52] U.S. Cl. .................... 333/30 R; 333/70 T; 333/72; 364/821
[58] Field of Search .................... 333/30 R, 72, 70 T; 235/181; 310/8–8.2, 9.8, 311, 313, 314, 318, 320, 321, 322, 334, 335

[56] References Cited

U.S. PATENT DOCUMENTS 3,851,280 11/1974 Staples .................... 333/30 R
3,942,135 3/1976 Moor et al. .................... 333/30 R X

OTHER PUBLICATIONS

Reeder et al., "Convolution and Correlation by Nonlinear Interaction in a Diode-Coupled Tapped Delay Line" Appl. Phys. Lett., Jan., 1973; pp. 8–10.
Hunsinger et al., "Programmable Surface-Wave Tapped Delay Line" IEEE Trans. on Sonics and Ultrasonics, July 1971; pp. 152–154.

Primary Examiner—Eli Lieberman
Assistant Examiner—Marvin Nussbaum
Attorney, Agent, or Firm—Dominic J. Chiantera

[57] ABSTRACT

A surface acoustic wave (SAW) tapped delay line, including a piezoelectric substrate having a pair of signal launching transducers disposed thereon for providing surface acoustic waves in the substrate in response to electrical signals applied thereto, and including a plurality of transducer taps disposed in an interaction region of the substrate for providing a plurality of sensed electrical signals in response to the surface acoustic waves propagating through the interaction region, the plurality of sensed electrical signals including signals at the frequency of each of the acoustic waves, is combined with a plurality of nonlinear frequency mixers, each responsive to a corresponding one of the transducer taps, and each providing signal manifestations of the sum and difference frequency of the surface acoustic waves in a selected one of two phases which are displaced by 180° with respect to each other, the combination of the SAW tapped delay line and plurality of selective phase nonlinear frequency mixers providing a programmable phase, nonlinear surface acoustic wave PSK encoder/correlator.

9 Claims, 10 Drawing Figures

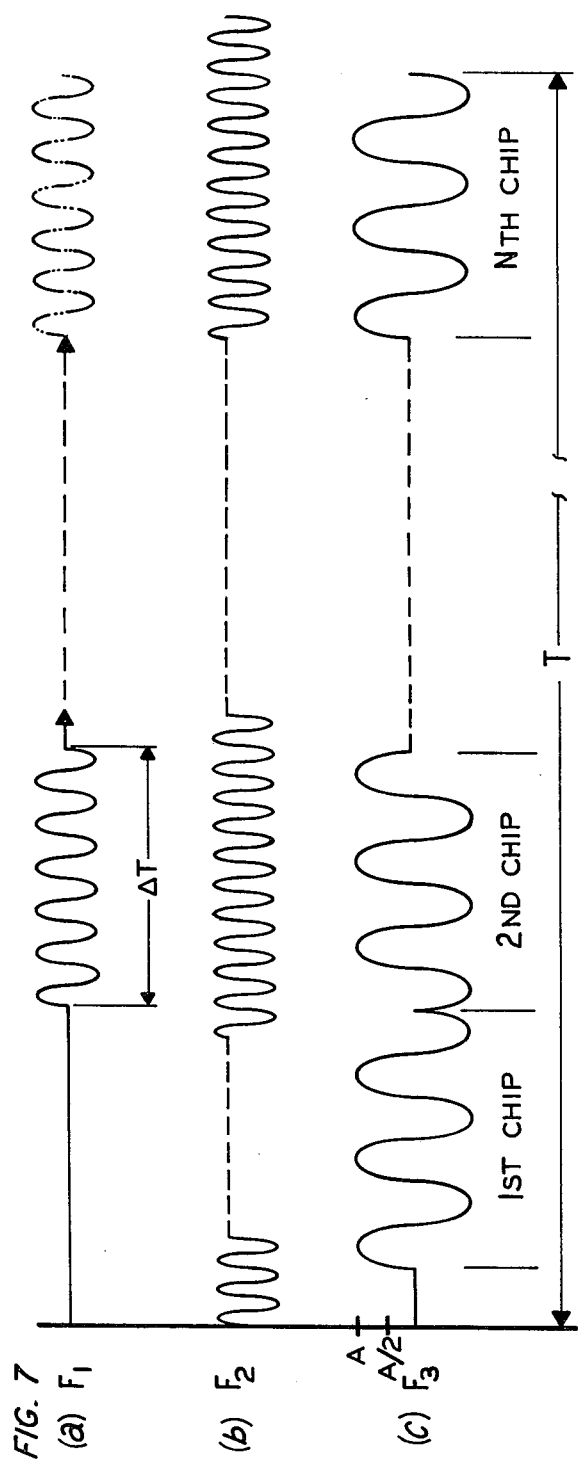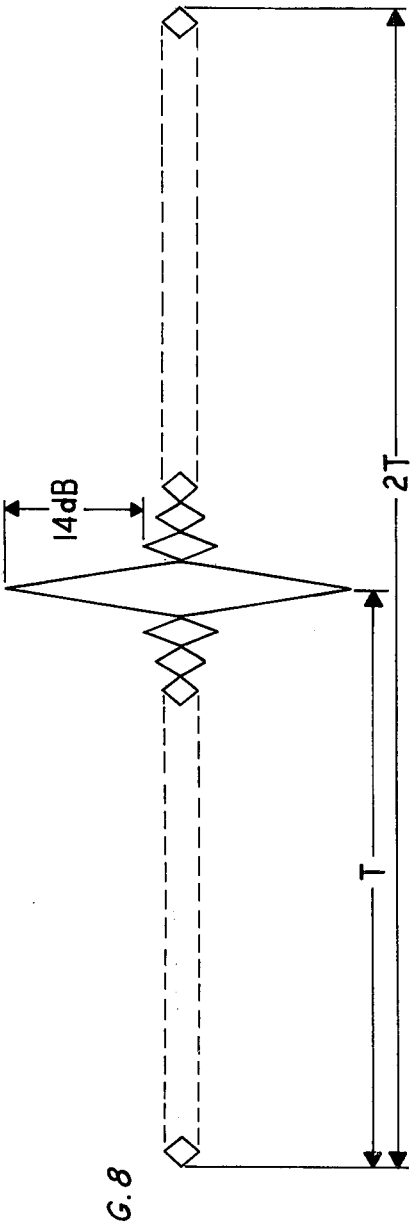

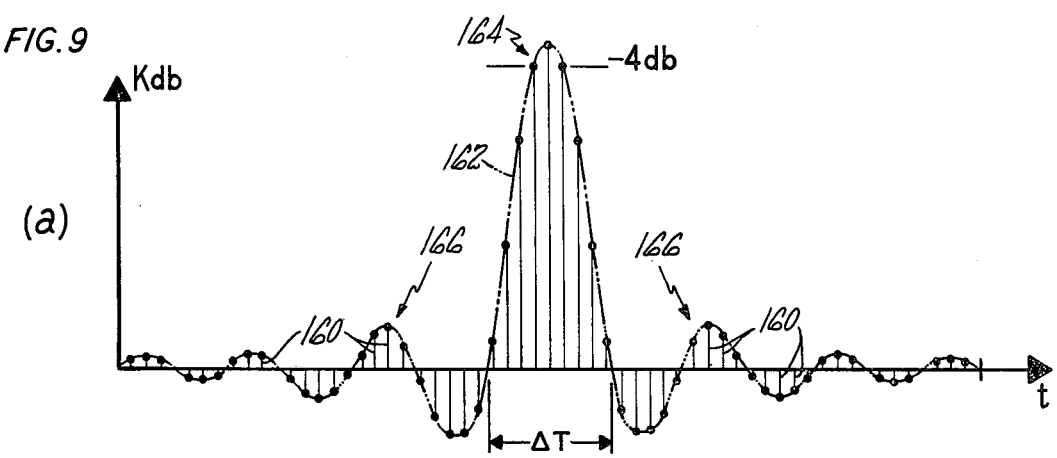
FIG. 9
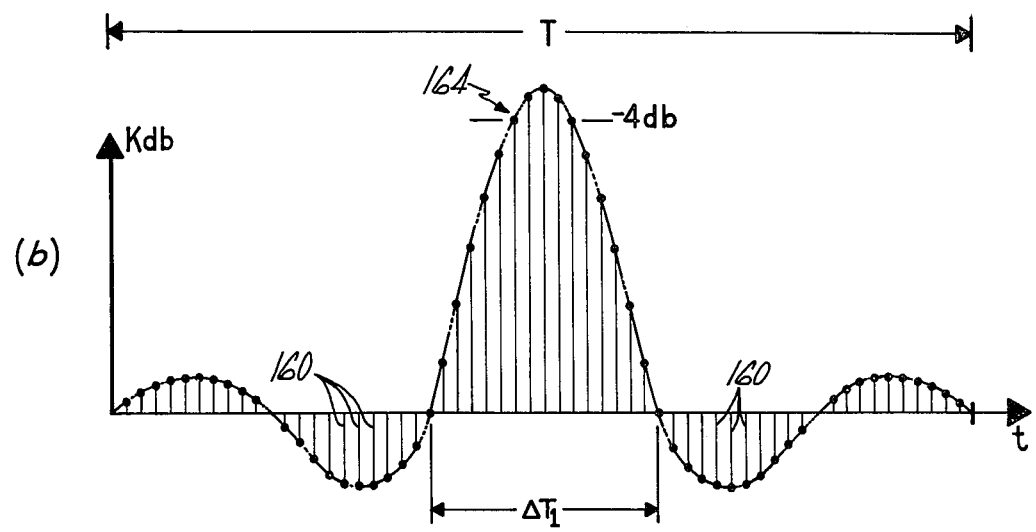
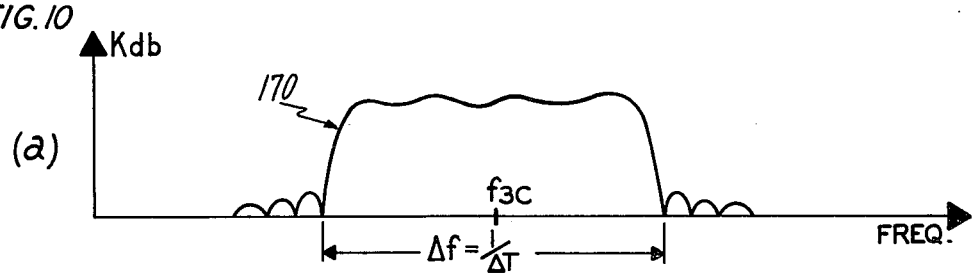
FIG. 10
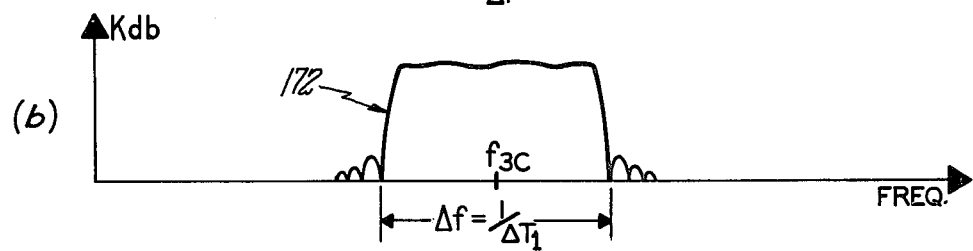

NONLINEAR SURFACE ACOUSTIC WAVE PSK ENCODER/CORRELATOR

CROSS REFERENCE TO RELATED APPLICATIONS

The subject matter hereof is also disclosed, and some of it is claimed, in a commonly owned U.S. Patent entitled PROGRAMMABLE, AMPLITUDE AND PHASE, GENERAL TRANSVERSAL FILTER, U.S. Pat. No. 4,024,480 filed on even date herewith by Thomas M. Reeder and Thomas W. Grudkowski.

BACKGROUND OF THE INVENTION

1. Field of Invention

This invention relates to a programmable surface acoustic wave (SAW) tapped delay line, and more particularly to a nonlinear programmable SAW delay line providing selective bi-phase programming of the individual tap electrodes.

2. Description of the Prior Art

The surface acoustic wave (SAW) tapped delay line is well known in the art, and the use of these SAW devices for encoding and correlating fixed and programmable phase shift key (PSK) codes, and for providing nondispersive and dispersive filters for generation and detection of various waveforms is also known, as reported by M. G. Holland and L. T. Claiborne, "Practical Surface Acoustic Wave Device", Proceedings of the IEEE, Vol. 62, pages 582-611, May 1974. The basic function of the SAW device in both applications is to provide the real time signal correlation and convolution of input signals.

The use of SAW delay line devices for real time signal correlation and convolution of input signals through nonlinear wave interaction is described by C. F. Quate and R. B. Thompson, "Convolution and Correlation in Real Time With Nonlinear Acoustics", Applied Physics Letters, Vol. 16, pages 494-496, June 1970. The nonlinear SAW correlator and convolver disclosed by Quate and Thompson provides the convolution and correlation of two applied signals by taking the product of the two signal frequencies, and integrating the product over a period of time. The product of the two signals in the Quate convolver is achieved by the nonlinear interaction of the two amplitude modulated SAW's as they pass through a piezoelectric crystal with different phase velocities causing an electrical polarization to be induced in the piezoelectric crystal which is proportional to the product of the two amplitude modulated functions. In a commonly owned U.S. Patent of the same assignee entitled "Diode Coupled Tapped Acoustic Delay Line Correlator and Convolver", U.S. Pat. No. 4,016,514, filed Oct. 9, 1973, a diodetapped delay line correlator is disclosed which is similar in operation to the nonlinear acoustic wave correlator disclosed by Quate and Thompson, but which in contrast provides the nonlinear signal frequency mixing in the diode associated with each tap, the nonlinear, signal transfer characteristic of the forward biased diode providing the product of the applied input signal. The large nonlinearity available in the semiconductor diodes provides a greatly enhanced product signal amplitude, with a correspondingly low insertion loss, however, only uniphase operation of each tap is permitted.

Since the significant uses of the SAW tapped delay line in the communication field relate to correlation and encoding of (PSK) signals which require bi-phase operation of the taps, the development of a SAW delay line apparatus which provides nonlinear wave interaction and which can be readily programmed for bi-phase operation is desirable. Bi-phase SAW devices have been developed for switching the taps to one of two phases which are displaced by 180°, through the use of a quad-diode switching technique, as described by Holland and Claiborne, Ibid., at pages 596, et seq. The quad-diode switching configuration therediscussed, and similar such devices presently known in the art function as electronic single pole, double throw switches which selectively reverse the opposite phase electrodes of the individual delay line taps to provide the bi-phase operation. These devices suffer from a number of disadvantages including: complexity, a relatively large number of components which results in low reliability, high DC power requirements, and a low switching speed resulting from the combined diode junction capacitance.

Similarly, the use of the SAW tapped delay line in providing programmable dispersive, or nondispersive transversal filters, requires a SAW device capable of providing nonlinear wave interaction together with both bi-phase operation of the taps and selectively adjustable tap signal amplitudes, to provide a programmable phase/amplitude device suitable for frequency filter synthesis. In both applications, that of bi-phase operation of the delay line taps, and bi-phase operation of the taps combined with adjustable tap signal amplitudes, high programming speeds and low power consumption are required to provide high reliability devices. Such programmable SAW delay lines are not presently known in the art.

SUMMARY OF THE INVENTION

An object of the present invention is to provide a nonlinear surface acoustic wave, phase shift key (PSK) encoder/correlator.

According to the present invention, a PSK encoder/correlator includes, a nondispersive surface acoustic wave (SAW) tapped delay line having a piezoelectric substrate including a major surface with a pair of signal launching transducers disposed thereon for providing surface acoustic waves in the substrate at a frequency in dependence on the frequency of electrical signals applied thereto, the delay line further having a plurality of transducer taps disposed in an interaction region of the major surface, each providing a plurality of sensed electrical signals in response to surface acoustic waves impinging thereon in the interaction region, the sensed signals including electrical signals at the frequency of each of the acoustic waves, the PSK encoder/correlator further including a plurality of nonlinear frequency mixers, each responsive to the sensed signals from a corresponding one of the transducer taps for providing signal manifestations of the sum and difference frequencies of the surface acoustic waves impinging on the tap, each providing the signal manifestation at a selected one of two phases which are displaced by 180°, the signal manifestations from each of the nonlinear frequency mixers being summed along a common signal line. In further accord with the present invention, the filter further includes a programmable voltage source for providing a plurality of bias signals, one for each of the nonlinear frequency mixers, each bias signal being selectively provided at a first polarity or a second polarity, alternatively, wherein each of the nonlinear frequency mixers includes a nonlinear signal transfer characteristic in each of two quadrants which are displaced by 180°, each nonlinear transfer characteristic providing frequency mixing of the sensed electrical signals in a selected one of the two quadrants in dependence on the polarity of the bias signal applied thereto. In still further accord with the present invention, the programmable voltage source provides each nonlinear frequency mixer with the bias signal through a pair of signal lines and each of the nonlinear frequency mixers includes a pair of semiconductor diodes connected between the pair of signal lines in an opposite sense, parallel arrangement wherein the cathode of a first diode is electrically common with the anode of a second diode, to provide a nonlinear signal transfer characteristic in each of two quadrants which are displaced by 180°.

In still further accord with the present invention, the pair of signal launching transducers are adjacently disposed on a common end portion of the substrate major surface, and the plurality of transducer taps are disposed in the interaction region in a tilted tap array configuration wherein each of the plurality of transducer taps are equally displaced from adjacent taps in each of two orthogonal dimensions, each of the transducer taps including a pair of opposite phase electrodes relatively disposed in an interdigital configuration, each of the opposite phase electrodes having a split finger construction, a common one of the opposite phase electrodes of each transducer tap being connected to a common electrical signal conductor, the other one of the opposite phase electrodes of each of the transducer taps being connected to a corresponding one of the nonlinear frequency mixers. In still further accord with the present invention, the filter includes a plurality of impedance isolation networks, each responsive to the signal manifestations from a corresponding one of the nonlinear frequency mixers, each providing impedance matching between the corresponding frequency mixer and the common signal line.

The programmable amplitude and phase general transversal filter of the present invention provides a nonlinear surface acoustic wave device capable of providing PSK signal encoding a correlation of long bit length codes. The programmed, or selected phase is provided through a simplified nonlinear mixer configuration which provides a signal frequency mixing in the selected one of a first or second phase in response to the polarity of a bias signal applied thereto. The phase of the signal manifestations of each mixer may be changed individually, or jointly, at a high switching speed due to the limited number of elements in each mixer, while the limited number of components in each mixer results in a programmable transversal filter having low power consumption.

Other objects, features and advantages of the present invention will become more apparent in the light of the following detailed description of the preferred embodiments thereof, as illustrated in the accompanying drawing.

BRIEF DESCRIPTION OF THE DRAWING

FIG. 7 is an illustration of a portion of a phase shift key (PSK) signal used in the description of the embodiment of FIG. 1;

FIG. 8 is an illustration of a correlation output of a PSK signal used in the description of the embodiment of FIG. 1;

FIG. 9 is an illustration of a sin X/X time response provided by the programmed amplitude and phase weighting of the transducer taps in the embodiment of FIG. 1; and FIG. 10 is an illustration of the frequency response of the sin X/X time response of FIG. 9.

DESCRIPTION OF THE PREFERRED EMBODIMENT

Figure 1:
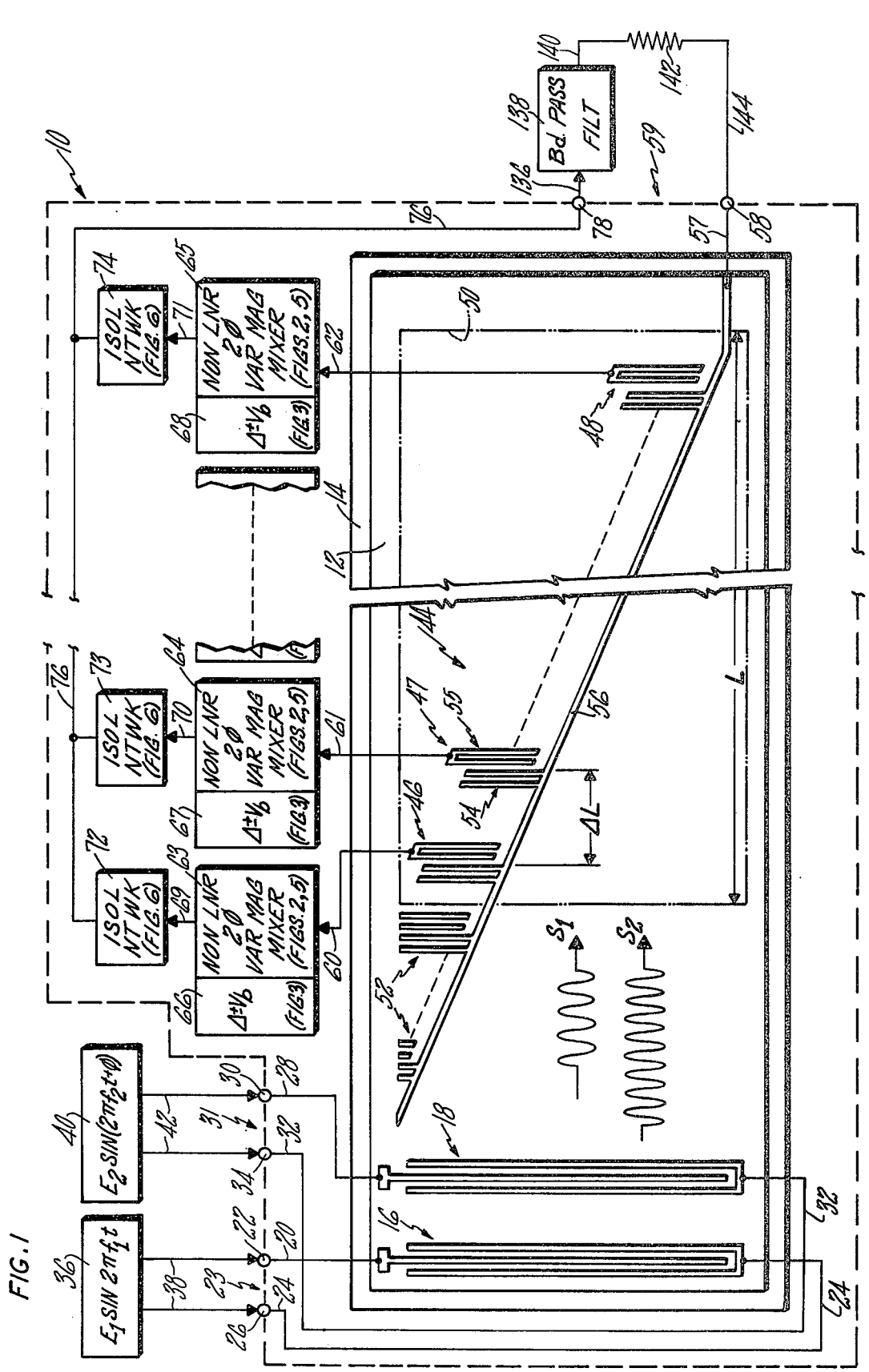
FIG. 1 is a schematic diagram of an illustrative embodiment of a programmable surface acoustic wave tapped delay line according to the present invention.

Referring now to FIG. 1, in an illustrative embodiment of a programmable surface acoustic wave (SAW) delay line 10 according to the present invention, a piezoelectric material substrate 12, such as yz lithium niobate (which provides a combination of strong piezoelectric coupling with low acoustic propagation loss and large time delay per unit length), or gallium arsenide, is formed in the shape of a flat bar and disposed on a surface of a supporting base 14. Two interdigital (ID), surface acoustic wave (SAW), launching transducers 16, 18 are disposed at one end of an exposed surface of the substrate 12 through a suitable photolithographic process, such as that used for providing metallization in integrated circuit manufacturing. The launching transducers 16, 18 are shown in an ID configuration having one pair of opposite phase electrodes each, however, they may be configured in a number of other array configurations known in the art, including a multi-electrode pair ID configuration, with consideration given to the operating frequency and frequency bandwidth. The center electrode of transducer 16 is connected through a line 20 to a terminal 22 of a first input port 23, and the opposite phase electrode of transducer 16 is connected through a line 24 to a second terminal 26 of the input port 23. Similarly, the center electrode of transducer 18 is connected through a line 28 to a terminal 30 of a second input port 31, while the opposite phase electrode of transducer 18 is connected through a line 32 to a second terminal 34 of the input port 31. The input ports 23, 31 receive the respective input and reference signals on which the signal processing is to be performed, as described hereinafter. These signals are defined generally as having amplitudes $E_1$, $E_2$ and frequencies $f_1$, $f_2$ respectively. In FIG. 1, $E_1$ is provided by a signal source 36 through a set of lines 38 to the input port 23, and the signal $E_2$ is provided by a signal source 40 through a set of lines 42 to the port 31.

The ID pattern of the transducers 16, 18 is a simple type wherein the width and spacing of the electrodes is equal, and uniform throughout the pattern. The physical phenomena of converting an electrical signal presented to the transducer into a SAW is well known and reported in the art (N. G. Holland and L. P. Claiborne, "Practical Surface Acoustic Wave Devices", Proceedings of the IEEE, Vol. 62, pages 582–611, May 1974).

Simply stated, the electrical signal presented to the opposite phase electrodes of the transducer ID pattern excites a periodic electric field which penetrates into the piezoelectric substrate. The substrate responds by periodically expanding and contracting in phase with the electric field, creating a SAW which propagates along the surface of the substrate in two directions normal to the transducer ID electrodes. Since the only SAW's of interest are those propagating along the remaining portion of the substrate, acoustic absorbing material may be added to the substrate to absorb the opposite direction wave. The strongest SAW from the ID transducer occurs near the resonant frequency of the transducer ($f_o$) defined by the SAW velocity ($v$) and the periodic length ($l$) of the transducer ID pattern, as: $f_o = v/l$. The period length $l$ of the transducers 16, 18 is equal to one wavelength ($\lambda$) of the frequency at which the transducer operates, such that the electrode width and spacing is equal to $\lambda/4$. Therefore, for different operating frequencies $f_1$ and $f_2$, the geometry of the ID patterns of the transducers 16, 18 will differ. The stress output (T) from the uniform ID transducers 16, 18, which produces the SAW, has the form $$T \simeq N \frac{\sin N \pi (f-f_o)}{N \pi (f-f_o)};$$

where N is the number of periodic lengths ($l$) of the transducer ID pattern, and f is the excitation frequency. The uniform ID transducer, therefore, has a sin X/X type of frequency response, with the bandwidth inversely proportional to N.

An array 44 comprising a plurality of equally spaced taps is disposed along the remaining surface of the substrate 12 from a portion adjacent to the launching transducers 16, 18 and extending along the length of the substrate to the opposite end. The plurality of taps in the array 44 is comprised of a plurality of transducer taps 46–48 disposed within an interaction region of the substrate 12, shown generally by the phantom boundary 50, and a plurality of dummy, or inactive, taps 52 disposed on the portion of the substrate 12 between the interaction region 50 and the launching transducers 16, 18. The array 44 is disposed in a "tilted tap" configuration known in the art, wherein each transducer tap overlaps only a fraction of the total SAW wavefront propagating through the interaction region 50, thereby minimizing SAW attenuation, and transducer inter-electrode reflections. The dummy taps 52 fill in the truncated portion of the array, i.e. that portion of the array created by the slant geometry in which the length of the transducer tap electrodes are less than that required for full overlap, to provide uniform propagation and attenuation characteristics for the SAW in that portion of the substrate 12.

The transducer and dummy taps of the array 44 are equally spaced along the surface of the substrate 12 with the distance between the centers of the taps along a line orthogonal to the electrodes of the launching transducers 16, 18 (the direction of propagation of the SAW) being equal to $\Delta L$. The value of $\Delta L$ is fixed by the selection of the programmable SAW delay line operating frequency $f_3$, where $f_3 = f_2 \pm f_1$, as will be described in detail hereinafter. The taps are in an ID configuration and are disposed on the substrate surface by a metallization process similar to that of the transducers 16, 18. The taps each comprise a pair of opposite phase electrodes, each electrode having a split finger construction to reduce by one-half the periodic acoustic discontinuity seen by the SAW as it propagates beneath the transducer tap, causing acoustic reflections to occur at twice the resonant frequency of the transducer which is outside the frequency band of interest. The finger width and spacing is equal to $\lambda/8$, and is uniform throughout the ID pattern creating an N = ½, or one-half wavelength ID transducer, where the wavelength is that of the mean frequency ($f_m$) of the two input signal frequencies $f_1$, $f_2$ [$f_m = (f_1 + f_2)/2$]. The tap configuration is one of a number of known ID configurations which may be suitable, the exact configuration selected being dependent on the total number of transducer taps included in the array 44, with consideration given to minimizing acoustic wave reflections, and to provide weak transducer tap coupling of the SAW to minimize wave attenuation.

The opposite phase electrodes in each of the transducer taps are electrically isolated, as shown by the electrodes 54, 56 of the transducer tap 47. A commonly orientated opposite phase electrode of each of the transducer taps 46–48, and of the dummy taps 52 is electrically connected to a common signal line, or metallized bus bar 56 which extends along the length of the array 44, such that the commonly orientated opposite phase electrode of each of the plurality of taps are electrically common. The metallized bus bar 56 is connected through a line 57 to a terminal 58 of an output port 59. The other of the opposite phase electrodes of the dummy taps are open, while those of the transducers 46–48 are connected through lines 60–62 to a plurality of nonlinear frequency mixer circuits 63–65, each of which is provided with a bipolar, adjustable magnitude bias signal provided by programmable voltage sources 66–68. The outputs of the frequency mixer circuits 63–65 are connected through lines 69–71 to isolation networks 72–74, the outputs of which are connected through a common signal line 76 to a second terminal 78 of the output port 59.

The mixer circuits 63–65 are identical, as are the isolation networks 72–74, and the programmable voltage sources 66–68. Each of the mixer circuits 64–65 provides a nonlinear signal transfer characteristic in each of two quadrants that are 180° out of phase. As described in detail hereinafter, the nonlinear transfer characteristic provides a frequency mixing function which results in all possible mixing combinations of the two input frequencies $f_1$, $f_2$ and their harmonics, including the sum and difference of the input frequencies ($f_3 = f_2 \pm f_1$). The nonlinear characteristic provides a dynamic impedance ($r_d = \Delta E/\Delta I$) which is small compared to the impedance of the transducer tap and which is adjustable in dependence on a bias current signal applied, providing an adjustable amplitude response of the $f_3$ signal over a wide dynamic range. The combined bi-phase characteristic of the mixer circuit provides an $f_3$ signal frequency that is either in phase, or 180° out of phase with respect to the input signals. In addition, the mixer circuits 63–65 may take the form of alternate embodiments, i.e. a shunt embodiment for voltage signal mixing, and a series embodiment for current signal mixing.

Figure 2:
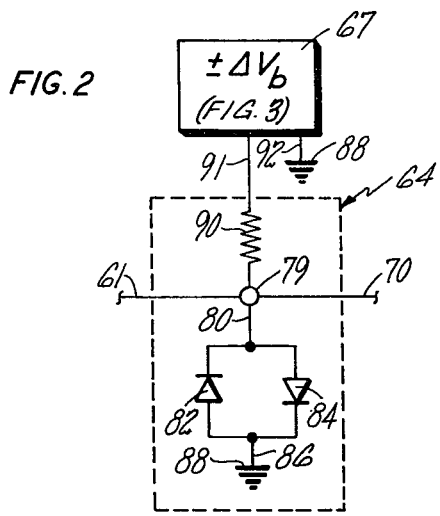
FIG. 2 is a schematic diagram of a nonlinear frequency mixer as used in the embodiment of FIG. 1.

A shunt embodiment of a nonlinear frequency mixer circuit, as may be used in the voltage signal mixing mode, is shown in FIG. 2 for the mixer circuit 64. The sensed electrical signals appearing at the electrode 55 of the transducer tap 47 created by SAW propagating beneath the electrode, includes the operating frequencies $f_1$, $f_2$ of the launching transducers 16, 18, and the mean $f_m$ of these two frequencies. While the periodic length ($l$) of the transducer taps is adjusted for one-half wavelength of $f_m$, the use of only a single electrode pair in each transducer tap results in a low transducer frequency selectivity, such that the transducer insertion loss versus frequency provides a minimum signal attenuation over a broad frequency range centered around $f_m$ which is relatively constant between the operating frequencies $f_1$ and $f_2$, rather than a high Q characteristic. The composite frequency, sensed electrical signals are presented through the line 61 to the nonlinear mixer 64 at a junction 79. The junction 79 is connected through a line 80 to a pair of semiconductor diodes 82, 84, electrically connected in parallel in an opposite polarity configuration, such that the cathode of one diode is common with the anode of the other diode, the other side of the parallel diode configuration being connected through a line 86 to a ground plane 88. The junction 79 is connected to the output of the mixer 64 on the line 70, and is also connected through a resistor 90 and a line 91 to the signal output of the programmable voltage source 67, which has a signal return side connected through a line 92 to the ground plane 88.

The programmable voltage source 67 provides a DC bias signal $V_b$ which is selectively adjustable, or programmable, to provide variable magnitude DC voltage signals at any one of a number of different magnitudes within prescribed limits determined by the dynamic range of the nonlinear mixer, as described in detail hereinafter. In addition, the programmable source 67 provides the variable amplitude DC voltage signal in a selected one of two polarities either positive or negative. The voltage source 67 may be programmed in a multitude of ways, from human programming using fixed positive and negative polarity voltage sources connected to a simple single pole double throw switch, where the selected polarity voltage signal amplitude is adjusted with a potentiometer, to an electronic switching configuration using a programmed computer to control the selected polarity and magnitude, the exact apparatus depending on the programmed SAW delay line use. Similarly, either polarity or magnitude alone may be programmed, i.e., providing constant magnitude bipolar bias signals, or unipolar variable magnitude bias signals. One embodiment of a programmable voltage source using electronic switching and a control computer is shown in the system block diagram of FIG. 3.

Figure 3:
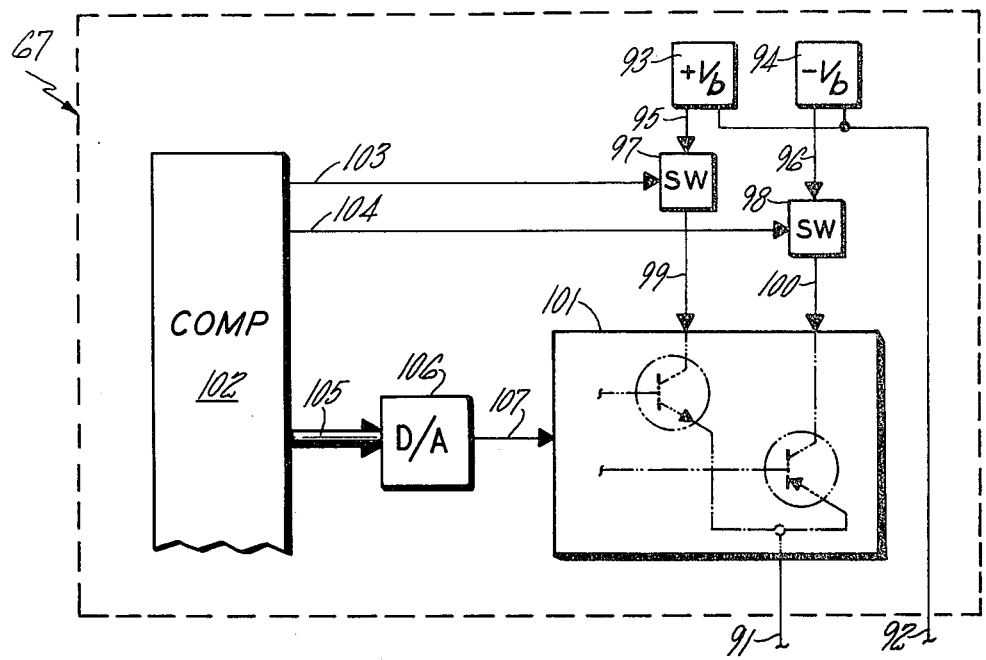
FIG. 3 is a schematic diagram of a programmable voltage source used in the embodiment of FIGS. 1, 2 and 5.

Referring now to FIG. 3, a positive voltage source 93, and a negative voltage source 94, have their high potential outputs connected through lines 95, 96 to controlled switches 97, 98, the outputs of which are provided on the lines 99, 100 to a magnitude control circuit 101. The switches may be gated semiconductor switches or the like, and the magnitude control circuit is of a type known in the art for controlling the magnitude of the applied signals through the use of suitably polarized series pass transistors. A control computer 102 provides a gate signal on one of the lines 103, 104 to turn on the respective switch 97, 98 causing the output of either source 93 or 94 to be presented to the magnitude control 101 in dependence on the selected polarity. In addition, the computer provides a digital word containing information of the desired bias signal magnitude on a set of lines 105 to a digital to analog (D/A) converter 106 which provides a corresponding analog control signal on a line 107 to the magnitude control circuit 101. The magnitude control circuit in response, provides a base drive signal to the base of the series pass transistors shown in phantom. The output of the magnitude control circuit 101 is then presented on the line 91 to the mixer 64.

Figure 4:
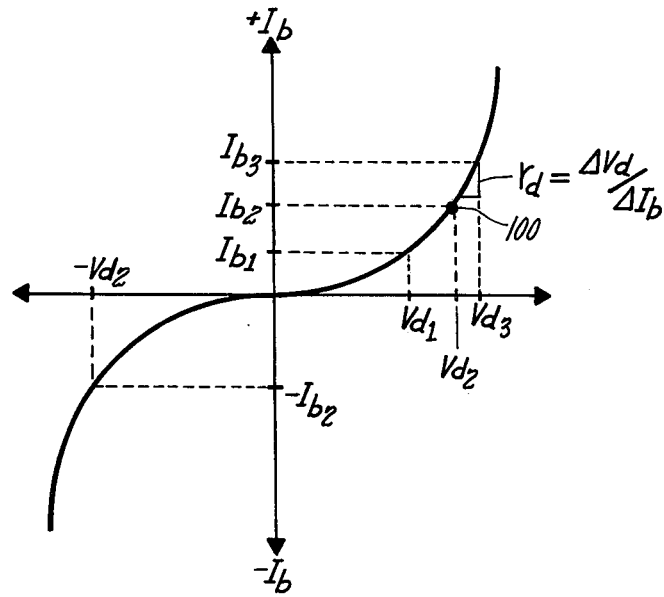
FIG. 4 is an illustration of the bi-phase nonlinear signal transfer characteristics of the nonlinear frequency mixer of FIGS. 2 and 5.

Referring again to FIG. 2, the composite nonlinear transfer function provided by the opposite polarity combination of the diodes 82, 84 is shown in FIG. 4 and are 180° out of phase. The polarity and magnitude of the voltage signal $V_b$ provided on the line 91 by the programmed source 67 determines which of the two diodes 82, 84 is forward biased, and the magnitude of the DC bias current ($I_b$) flowing through the diode. Assuming a positive polarity for $V_b$, such that the diode 84 is forward biased, with the magnitude of $V_b$ adjusted in proportion to the value of the resistor 90 to produce a current $+I_{b2}$ as shown in FIG. 4. The magnitude of the DC voltage signal at the junction 79 is equal to the diode voltage ($V_d$), or $V_{d2}$ for the diode 84 biased at a point 109 on its operating curve. The dynamic, or AC resistance ($r_d$) at point 109 is equal to $\Delta V_d/\Delta I_b$, and is therefore variable as a function of the DC bias current.

The nonlinear signal transfer characteristic provided by the nonlinear mixer provides a known signal frequency mixing function (see T. M. Reeder and M. Gilden, "Convolution and Correlation by Nonlinear Interaction in a Diode Coupled Tapped Delay Line", Applied Physics Letters, Vol. 22, pages 8–10, Jan. 1, 1973). The diode AC current ($I_d$) as a function of the voltage across the diode may be given by the expression: $I_d = I_b + I_o [\exp(V_d/V_m) - 1]$, where $I_o$ is the diode reverse current, $I_b$ is the DC bias current, $V_d$ is the diode voltage, and $V_m = kT/q$ is the thermal energy in electron volts. For a given bias current ($I_b$) the AC current expression may be expanded in a power series, such that: $I_d = g_b V_d + g'_b (V_d)^2 + \ldots$ where $g_b = (I_b + I_o)/V_m$ is the diode linear AC conductance, $g'_b = g_b/2V_m$ is the square law coupling coefficient, and so on. Since, due to the diode nonlinearity, the current and voltage will contain frequency components derived from all possible harmonic and mixing combinations of the two input carrier frequencies $f_1$ and $f_2$, the term $(V_d)^2$ may be written in terms of the input voltages as $(V_d)^2 = (E_1 \cdot E_2)$ such that the diode AC current resulting from the sum or difference frequency of the input frequencies $f_1$, $f_2$ is $I_{d3} = -G_1 E_1 E_2$, where $G_1$ is related to the small signal AC conductance ($g_b$), and the applied bias current ($I_b$) by the expression $G_1 = g_b^2/2I_b$. Depending on the polarity of the voltage signal $V_b$, one of the two diodes 82, 84 is forward biased while the other is reversed biased. Experiments have shown that nonlinear mixing effects are always much stronger in a forward biased diode under small signal operating conditions, i.e. where $V_d < V_m = kT/q$. Therefore, the nonlinear mixing in the reversed polarity parallel diode combination is controlled by the forward biased diode. When the polarity of the current through the diode parallel pair is reversed (by reversing the polarity of $V_b$) the second diode becomes forward biased and the relative polarity of $I_b$, and $V_d$, the current and voltage through the junction 79, are all reversed. This reversal changes the sign of the nonlinear output in the expression for the diode current above; i.e. $G_1 = g_b^2/-2I_b$, and $I_{d3} = -(-G_1) E_1 E_2 = +G_1 E_1 E_2$ which is equivalent to changing the tapped phase by exactly 180°.

As stated hereinbefore, signal mixing in the nonlinear mixer circuit provides a resultant signal at a frequency $f_3$ equal to the sum or difference of the input frequency, and while either the sum or difference frequency may be used, the difference frequency ($f_3 = f_2 - f_1$) is generally preferred for two reasons: the insertion loss is typically 5 to 10 db lower for difference frequency operation, and the filtering of unwanted fundamental and harmonic frequency components other than $f_3$ is easily accomplished with a simple bandpass filter.

The amplitude of the mixed frequency resultant signal is dependent on the efficiency of both the transducer tap and the respective nonlinear mixer. The efficiency of the transducer tap and nonlinear mixer is correspondingly defined by the insertion loss, which for the nonlinear mixer circuit 65 is a function of the bilinear relationship of the diode current-voltage characteristics, as reported in an article by T. M. Reeder, "Insertion Loss and Saturation Effects in the Diode Correlator", Electronics Letters, Vol. 9, pages 254–256, May 1973. As stated therein, the complete insertion loss ($L_{31}$) is a function of the average SAW propagation loss ($L_l$) resulting from propagation through the transducer tap in the interaction region, and the conversion loss ($L_1$) of the launching transducer (16, 18) in providing the conversion of the electrical input signal, the resulting expression being equal to: $L_{31} = L_1 \sqrt{L_I/F_1 p_{as}}$, where $F_I$ is the internal bilinearity factor (T. M. Reeder, Ibid.) determined by the diode-transducer tap interaction region parameters, and $P_{as}$ is the saturation level acoustic power applied at the signal input port (the input signal amplitude which causes the diode AC current $I_d$ to become equal to the diode DC bias current $I_b$, causing the diode to begin to saturate). The minimum insertion loss for the transducer tap is obtained when the diode DC bias current $I_b$ is adjusted to provide a diode operating point where the AC diode resistance: $r_d \approx (2PR_L X_m^2)^{\frac{1}{2}}$, where $R_L$ is the load resistance of the output port 59 and $X_m$ is the transducer tap reactance at the mean input frequency [$f_m = (f_1 + f_2)/2$]. This value of diode resistance is easily obtained since the AC resistance varies inversely with the DC bias current as shown in the expression $r_d = V_m/I_b$, where $V_m$ is the effective thermal voltage as described hereinbefore, and $I_b$ is the DC bias current through the diode. Therefore, by adjusting $I_b$, the insertion loss of the combined transducer tap and nonlinear mixer may be adjusted, which provides an adjustable amplitude for the frequency mixed signal at the output of the mixer 64 on the line 70. This provides a dynamic range over which the output signal amplitude may be adjusted, such that each nonlinear mixer may provide an amplitude signal which is equal or different from the amplitude signal, at each of the other mixers, i.e. transducer tap amplitude "weighting" which is usable in general matched filter signal encoding and correlation. The range of these signal amplitudes at the output port 59 has a lower limit defined by the noise output at the port from the nonlinear mixer circuit, and an upper limit defined by the nonlinear mixer circuit saturation limit. In the programmable SAW delay line of the present invention, effective dynamic ranges (AC resistance $r_d$ versus DC bias current $I_b$) of 20 db are achievable without the use of isolation networks 72–74, while dynamic range values in the order of 40 db may be achieved by providing suitable isolation networks at the mixer circuit outputs.

While the bi-phase nonlinear transfer characteristic of the mixer circuits 63–65, shown generally in FIG. 3, is provided by the parallel combination of opposite polarity diodes, the nonlinear characteristic may likewise be provided through a field effect transistor pair which provides a quadratic relationship for drain to source current and voltage. For the diode pair, the preferred diode semiconductor material and construction is planar silicon on sapphire (SOS), since the sapphire provides a good insulator for reducing the intrinsic coupling between diodes of different transducer taps caused by the resistance effects of the substrate material, although other semiconductor material and construction may be used, such as epitaxial construction using gallium arsenide.

Figure 5:
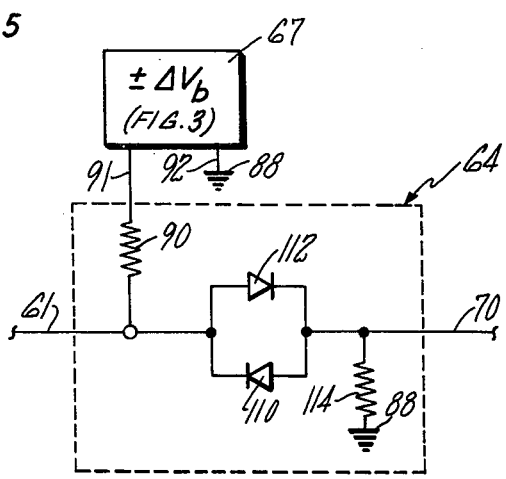
FIG. 5 is a schematic diagram of another embodiment of a nonlinear frequency mixer used in the embodiment of FIG. 1.

An alternative embodiment of the nonlinear mixing circuit 65 for current signal mixing is shown in FIG. 5, wherein the signals on the line 61 are presented to the junction 79 which, as in the FIG. 2 embodiment, is connected through the resistor 90 and the 91 to the high signal side of the programmable voltage source 67 providing the bipolar selective magnitude DC voltage signal $V_b$. In FIG. 5, however, the junction 79 is connected through a pair of opposite polarity, parallel diodes 110, 112 to the output of the mixer circuit on the line 70. The diodes 110, 112 are identical to the diodes 82, 84 of FIG. 2 and are connected in the same parallel relationship; however, the parallel combination of diodes 110, 112 provides a series network element as opposed to the shunt network element of FIG. 2. The mixer output line 70 is also connected through a resistor 114 to the ground plane 88, to provide a bias current return path for the voltage signal $V_b$. In contrast to the embodiment of FIG. 2, where the voltage signal at the junction 79 represented the sum and difference frequency signal of the input frequency signals, the FIG. 5 embodiment provides a current sum and difference frequency signal generated in the forward biased diode of the parallel diodes 110, 112, which is presented to the output line 70.

Figure 6:
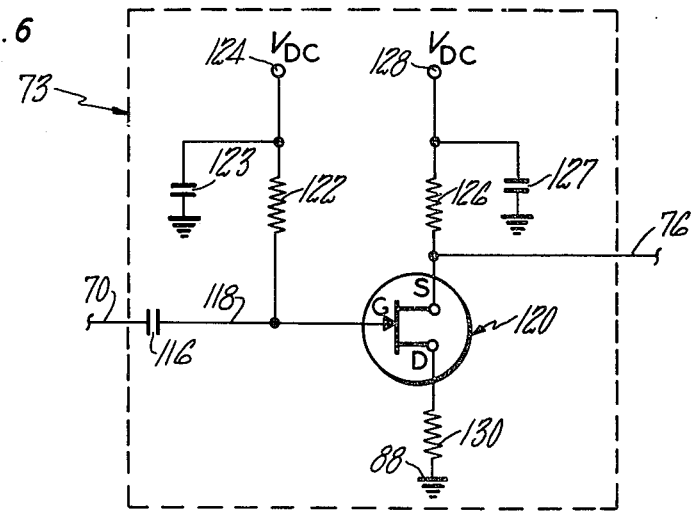
FIG. 6 is a schematic diagram of an isolation network used in the embodiment of FIG. 1.

The isolation networks 72–74 provide isolation between the individual transducer taps and their respective nonlinear mixing circuits, to reduce the cross talk between the tap signals which may be at different amplitudes and phase polarity. The isolation networks may be of any standard configuration known in the art, such as the embodiment shown in FIG. 6, wherein the output of the nonlinear mixer on the line 70 is coupled through a capacitor 116 on a line 118 to the gate of a field effect transistor (FET) 120. The capacitor 116 blocks the DC component of the signal on the line 70 (current and voltage) and couples only the resultant AC mixed signal to the gate of the FET 120. The FET 120 may be of any known type (P channel or N channel). The line 118 is also connected through a resistor 122 to a bypass capacitor 123, and a voltage source 124 of proper polarity for biasing the FET 120 at a suitable operating quiescent point. The drain terminal of the FET is connected through a resistor 130 to the ground plane 88, while the source terminal is connected through a resistor 126 to a second bypass capacitor 127 and a voltage source 128, which provides FET source to drain current. The output signal from the isolation network is provided at the source terminal of the FET 120, which is connected to the common signal line 76. As may be appreciated by those skilled in the art, the isolation network is one of a number of embodiments which may be used, with consideration given to the operating frequencies of the SAW delay line such that signal amplitude and phase distortion will be minimized.

Referring again to FIG. 1, the common signal line 76 presents the summation of all of the output signals from the isolation networks 72–74 to the terminal 78 of the output port 59. The terminal 78 is connected through a line 136 to a bandpass filter network 138 of a type well known in the art, which has a center frequency $f_3$ equal to the difference frequency ($f_3 = f_2 - f_1$), and a bandwidth which is determined by the operating frequency requirements of the SAW delay line. The output of the bandpass filter 138 is connected through a line 140 to a resistive load ($R_L$) 142, which is typically a 50 ohm termination, the other side of which is connected through a line 144 to the terminal 58 of the output port 59. The output signal at the port 59, which is the summation, or integration, of all of the difference frequency signal amplitudes from the individual nonlinear mixers 63–65, is measured across the resistor 142.

As known in the art, the velocity of a SAW is approximately five orders of magnitude smaller than the velocity of an electromagnetic wave of the same frequency, and consequently, the wavelength of the SAW is similarly five orders of magnitude smaller. This permits the use of a SAW device with relatively short length dimensions to provide signal correlation of long bit length signal codes, such as PSK codes. Since the piezoelectric substrate 12 is nondispersive, the SAW induced in the substrate by the launching transducers 16, 18 is an exact amplitude and phase replica of the electrical input signal to the extent of acoustic wave attenuation and reflection caused by the sampling of the waves by the transducer taps. In the programmable SAW delay line 10 of the present invention attenuation and reflections are minimized through the use of the "tilted tap" configuration, allowing the SAW to be "weakly coupled" into the respective transducer taps. The nondispersive characteristic of the substrate and the "weakly coupled" transducer tap sensing of the acoustic wave, together with the ability of the SAW delay line 10 to provide programmable amplitude and phase weighting of the individual transducer taps, allows this device to be used in a multitude of signal processing functions: the programmable bi-phase weighting permits its use in phase shift key (PSK) signal encoding and correlation functions, and the programmable bi-phase in combination with the programmable amplitude provides an apparatus capable of functioning as a general, programmable transversal filter for frequency filter synthesis.

In the operation of the SAW delay line 10 as a programmable PSK signal encoder, the polarity of the DC bias voltage $V_b$ of the individual nonlinear mixer circuits 63–65 are independently selected to provide the proper difference frequency signal phase shift (0° or 180°). The amplitude of the difference frequency signal at each mixer is constant and substantially equal. As known in the art, a PSK coded signal is defined in terms of its bit length, each bit being a unit of information which is comprised of a plurality of chips, each chip having a time duration ($\Delta T$) in seconds, and a constant repetition rate ($R_c$) in hertz per second ($\Delta T = 1/R_c$). The bit length is defined in terms of its time duration T where T = M . $\Delta T$, and M is the number of chips in the bit. To process the PSK code, the number of transducer taps must equal the number of chips in the bit length, with the periodicity of the transducer tap pattern $\Delta L$ (the spacing between the centers of the transducer taps along a line orthogonal to the launching transducers 16, 18) being equal to the product of the chip length $\Delta T$ and the SAW velocity $v$, or $\Delta L = \Delta T . v$. Since each chip is comprised of an integer number of cycles ($n$) of the difference frequency $f_3$, the periodicity $\Delta L$ may also be stated as: $\Delta L = n . \lambda_3$, where $\lambda_3$ is the wavelength of $f_3$. Therefore, the operating frequencies ($f_1, f_2$ and $f_3 = f_2 - f_1$) establish the geometry and the periodicity of the transducer taps. With the individual transducer tap nonlinear mixers programmed for the desired phase code sequence, they are scanned using a long reference signal $E_2$ at a frequency $f_2$; and a short input signal $E_1$, at a frequency $f_1$ which is equal in width to the desired chip length (the number of cycles of $f_1$ being equal to the time duration of the chip $\Delta T$).

FIG. 7 is an illustration of the PSK signal encoding described herein, where an input signal $E_1$ at frequency $f_1$ is shown in illustration ($a$) comprising six cycles having a total time duration equal to the chip duration $\Delta T$. A continuous reference signal $E_2$ at frequency $f_2$ is shown in illustration ($b$). The electrical signals $E_1, E_2$ are provided by the signal sources 36, 40 to the launching transducers 16, 18 respectively, which produce the SAW equivalent signals $S_1, S_2$. The phase of the $E_2$ reference signal is suitably adjusted to provide proper phase correlation with the input signal $E_1$. Assume that the input frequency $f_1$ is 71.1 MHz, and the frequency $f_2$ is 100.6 MHz, the respective SAW signals $S_1, S_2$ produced by these electrical signals propagate along the substrate 12 at the same frequencies in an in-phase spatial relationship. As stated hereinbefore, the transducer taps 46–48 have an ID length equal to one-half the wavelength of the means frequency $f_m$, or 85.5 MHz, such that as the two SAW waves $S_1, S_2$ propagate beneath the taps in the interaction region 50 they induce in each of the transducer taps the frequencies $f_1, f_2$ and $f_m$, and the nonlinear mixers 64–66 provide a difference frequency $f_3$ equal to 29.5 MHz. If a chip length is selected which comprises three cycles of $f_3$ ($n = 3$), the chip length is equal to $\Delta T = 0.1019$ microseconds, and the chip rate = 9.81 MHz. Since the SAW wave velocity is approximately equal to 3488 meters per second, the transducer tap periodicity $\Delta L \approx 3.556 . 10^{-4}$ meters, and the $f_3$ wavelength $\lambda_3 \approx 1.182 . 10^{-4}$ meters. The signal frequency $f_3$ provided by each of the mixers 63–65 is at a phase determined by the programmed code, and the resultant signals are provided on the common signal line 76 and measured at the output of the bandpass filter 138, across resistor 142 as a summed sequence of all of the respective transducer taps, as shown in FIG. 7, illustration ($c$). In FIG. 7 ($c$) it is assumed that the amplitude of the $f_3$ signal of all of the mixers is substantially equal, and that the mixer 63 provides an in-phase $f_3$ signal, the mixer 64 provides a signal that is 180° out of phase, and the mixer 65 provides an in-phase signal. With the simplified bi-phase configuration (two diode configurations) amplitude and phase programming speed of 100 nsec are obtainable. The number of transducer taps is equal to the number of chips in the PSK code, such that for a 64 chip code with a bit length T equal to 6.54 microseconds, the array 44 is comprised of 64 transducer taps. Although limited by the constraint of inducing excessive SAW attenuation and reflection, additional transducer taps may be provided to process longer bit length PSK codes.

In a somewhat similar fashion, the programmable SAW delay line 10 may be also used for PSK signal correlation, by providing an input signal $E_1$ containing the PSK coded sequence of bit length T, together with a short input reference signal $E_2$ having a time duration equal to the chip length $\Delta T$. The plurality of transducer taps are phase coded in a sequence which is identical to the anticipated input PSK signal code. As the transducer taps are scanned by the SAW equivalent of the PSK coded signal, and the reference SAW propagating along the substrate 12, the correlation of the input PSK code and the tap weights are shown by the summation of the difference frequency signals across the output resistor 142. For exact correlation, the output waveform across the resistor 142 will appear substantially as that shown in FIG. 8 for a PSK code having a bit length T, where the correlation output has a period 2T and a correlation peak at time T, with a peak to side lobe ratio of approximately 14 db. Since the phase of the individual taps may be quickly reprogrammed for different subsequent PSK codes, the SAW delay line can encode/correlate a continuous series of PSK signals.

Since the programmable SAW delay line 10 provides both programmable amplitude and bi-phase weighting of the individual transducer taps, it provides an apparatus which may be used as a generalized, programmable transversal filter for matched filter and frequency filter synthesis, in addition to its use as a PSK signal encoder/correlator. In its operation as a programmable transversal filter, the individual taps are amplitude and phase weighted to provide a finite, weighted sin X/X impulse response of amplitude versus time, as shown generally in FIG. 9. As stated hereinbefore, the uniform ID launching transducers have a sin X/X type of frequency response. The amplitude and phase of the plurality of nonlinear mixers 63–65 are selected to provide a desired "weighting function" for the sin X/X impulse response, as described by R. H. Tancrell, "Analytic Design of Surface Wave Bandpass Filters", IEEE Transactions on Sonics and Ultrasonics, Vol. SU-21, No. 1, Jan. 1974. This is shown in FIG. 9(a) by the vectors 160 which represent the various tap amplitudes and phase which in combination provide the weighted sin X/X impulse response shown by the phantom line 162. While a number of various weighting functions may be used, such as Hamming or Gausian, and others known in the art (Tancrell Ibid.), these are not described in detail herein. It is important only to realize that the programmable SAW delay line is capable of providing the desired weighting function (both phase and amplitude). As shown in FIG. 9(a) the response has a main lobe 164 and some number of side lobes 166 within the filter period T. The resolution of the response is determined by the number of transducer taps employed, which in turn defines the main lobe peak to side lobe peak ratio. Main lobe peak to side lobe peak ratios in the order of 20 db have been achieved with a total of 128 transducer taps. The period T of the response is determined by the total number of transducer taps employed, and the spacing ($\Delta L$) between the taps, which as stated hereinbefore with respect to the PSK encoder, is dependent on the operating difference frequency ($f_3$) selected. The actual sin X/X response provided by any given tap amplitude and phase weighting distribution, is examined by sweeping the transducer taps in an identical manner to that described hereinbefore with respect to the PSK signal encoding. The input signal $E_2$, at frequency $f_2$ having a signal duration in excess of the time period T of the response, is presented to the transducer 18 which provides the corresponding SAW at frequency $f_2$. Similarly, the input signal $E_1$ at the frequency $f_1$, having a signal duration proportional to the periodicity ($\Delta L$) of the transducer taps 46–48, is presented to the transducer 16 which provides a SAW $S_1$ at frequency $f_1$. As the two waveform propagate through the interaction region 50 the individual transducer tap sensed electrical signals are mixed in the selected one of the two oppositely polarized diodes in each of the corresponding nonlinear mixer circuits 64–70, as described hereinbefore. The amplitude of the $f_3$ signal at the output of the respective mixers 64–66, on the lines 68–70, is dependent on the DC bias current ($I_b$) flowing through the respective forward biased diodes of each mixer which is controlled by the magnitude of the voltage signal from the programmable voltage sources 66–68, as described in detail hereinbefore. The summation of the plurality of transducer tap $f_3$ signals provides the sin X/X response of FIG. 9(a), as measured across the resistor 142.

The sin X/X time response created by the programmed amplitude and phase provides the frequency transform shown by the rectangular envelope pulse 170, of FIG. 10, illustration (a), which has a center frequency $f_{3c}$ ($f_{3c} = f_{2c} - f_{1c}$) and a bandwidth of $\Delta f = 1/\Delta T$, where $\Delta T$ is analogous to the chip duration of the PSK encoder, described hereinbefore, and is equal to the tap periodicity ($\Delta L$) divided by the SAW velocity $v$, i.e. $\Delta T = \Delta L/v$. In the operation of the SAW delay line as a transversal filter, the input signal to be filtered $E_1$ is presented to the transducer 16, while a continuous wave reference signal $E_2$ is presented to the transducer 18. The bandpass filter 138 provides signal rejection of all but the $f_{3c} \pm \Delta f$ frequencies, and is at a bandwidth at least as great as the bandwidth $\Delta f$ provided by the programmed sin X/X time response. Therefore, the only $E_1$ input signals appearing across the output resistor 142 are those within the limits $f_1 = f_{2c} - (f_{3c} \pm \Delta f)$. The filtered input frequency signals within the bandpass $\Delta f$ may be used directly, or may be mixed with the reference frequency $f_{2c}$ to provide a restored, filtered $f_1$ signal frequency. Such further frequency mixing is not shown, nor described herein.

The programmed sin X/X response may be readily changed to provide a new frequency transform and new bandwidth by reprogramming the transducer tap weighting distribution. If the tap amplitude and phase weights are changed such that the $-4$ db points of the main lobe 164 are expanded with respect to time $\Delta T$, the result is a stretching out of the finite sin X/X response of FIG. 9(a), which results in the reduction of the number of side lobes in the response. The new response is shown in FIG. 9, illustration (b) which provides the narrower frequency bandwidth transform shown by the rectangular envelope 172 of FIG. 10, illustration (b), which again has a center frequency $f_3$, but a bandwidth $\Delta f = 1/\Delta T_1$ which is narrower due to the increase in the value of $\Delta T$. Conversely, a programmed tap distribution providing a compressed sin X/X time response (compression of the $-4$ db main lobe points with respect to time) results in a broader bandwidth frequency transform due to the decrease in the value of $\Delta T$.

The ability to provide programmable amplitude and bi-phase weighting of the transducer taps at high program speeds, and low power consumption requirements, allows use of the SAW delay line of the present invention as a transversal filter for use in electronic countermeasure (ECM) systems for providing frequency hopping techniques in the transmission of coded signal information, where the tap weights may be programmed at speed of up to 10 microseconds when a computer and electronic switching techniques are used to provide the specified tap weighting positions, as described hereinbefore with respect to the programmable voltage sources. The same is true for the SAW delay line as utilized in only the bi-phase operation, as in PSK signal encoding/correlation as described hereinbefore. Since, in general, the SAW delay line 10 provides: the convolution of an input signal with the amplitude, bi-phase weighted taps, the correlation of an input signal with the amplitude and bi-phase weighted taps, and the encoding of any given tap weight condition, it may also be used as a high speed time multiplexer, wherein a large number of parallel input analog signals, representative of sensed analog parameters such as time, temperature, are applied to the respective nonlinear mixer circuits through the DC signal source path, and are coded into a sequential, amplitude and phase code of desired bit length.

Similarly, although the invention has been shown and described with respect to an illustrative embodiment thereof, it should be understood by those skilled in the art that the foregoing and various other changes, omissions and additions in the form and detail thereof may be made therein without departing from the spirit and scope of this invention.

Having thus described a typical embodiment of my invention, that which I claim as new and desire to secure by Letters Patent is:

1. A nonlinear surface acoustic wave, phase shift key (PSK) encoder/correlator apparatus, for providing encoding and correlation of a pair of electrical signals of different determined frequency provided by a signal source, comprising:
   a nondispersive surface acoustic wave delay line including, a piezoelectric substrate having a major surface, a pair of signal launching transducers disposed on said major surface, each responsive to the pair of electrical signals, and each providing surface acoustic waves in said substrate at a frequency in dependence on a respective one of said electrical signals, said delay line further including a plurality of transducer taps disposed in an interaction region of said major surface, each providing a plurality of sensed electrical signals in response to surface acoustic waves impinging thereon in said interaction region, said sensed signals including electrical signals at the frequency of each of said acoustic waves;
   a plurality of nonlinear frequency mixer means, each responsive to said sensed electrical signals from a corresponding one of said transducer taps, and each having a nonlinear signal transfer characteristic in each of two quadrants displaced by one hundred eighty degrees, each of said mixer means providing, in either of said quadrants, alternatively, signal manifestations of the sum and difference frequency of the surface acoustic waves impinging on the tap; and
   summing means, responsive to the signal manifestations from each of said nonlinear frequency mixer means, for providing a summation thereof.

2. The apparatus of claim 1, further comprising:
   a programmable voltage source for providing a plurality of bias signals to said nonlinear frequency mixers, one for each of said nonlinear frequency mixers, each bias signal being provided in a selected one of a first polarity, or a second polarity opposite to said first polarity, alternatively; and wherein
   each of said nonlinear frequency mixers is selectably operable in either one of said two quadrants in dependence on the polarity of said bias signal applied thereto.

3. The apparatus of claim 2, wherein:
   said programmable voltage source provides each nonlinear frequency mixer with said bias signal through a pair of signal lines; and wherein
   each of said nonlinear frequency mixers includes a pair of semiconductor diodes connected between said pair of signal lines in an opposite sense, parallel arrangement wherein the cathode of a first diode is electrically common with the anode of a second diode, to provide said nonlinear signal transfer characteristic in each of said two quadrants which are displaced by 180°.

4. The apparatus of claim 3, further comprising:
   a plurality of impedance isolation networks, each interconnected between a corresponding one of said plurality of nonlinear frequency mixer means and said summing means and each responsive to the signal manifestation from the corresponding nonlinear frequency mixer means, to provide impedance level matching between said mixer means and said summing means.

5. The apparatus of claim 4, further comprising:
   frequency bandpass filter means, connected for response to said summing means, for providing frequency bandpass filtering of the summation of those of said signal manifestations representative of the difference frequency of the surface acoustic waves impinging on said transducer taps.

6. The apparatus of claim 1, wherein:
   said pair of launching transducers are adjacently disposed on a common end portion of said major surface; and wherein
   said plurality of transducer taps are disposed within said interaction region in a tilted tap array configuration wherein each of said transducer taps are equally displaced from adjacent ones of said taps in each of two orthogonal dimensions, each of said transducer taps including a pair of opposite phase electrodes relatively disposed in an interdigital configuration, each of said opposite phase electrodes having a split finger construction, a common one of said opposite phase electrodes of each of said transducer taps being connected to a common electrical signal conductor, the other one of said opposite phase electrodes of each of said transducer taps being connected to a corresponding one of said nonlinear frequency mixer means.

7. An improved nonlinear surface acoustic wave, phase shift key (PSK) encoder/correlator apparatus of the type which provides encoding and correlation of a pair of electrical signals of different determined frequency provided by a signal source, and which includes,
   a nondispersive surface acoustic wave delay line including, a piezoelectric substrate having a major surface, a pair of signal launching transducers disposed on the major surface, each responsive to the electrical signals from the signal source and each providing surface acoustic waves in the substrate at a frequency in dependence on a respective one of the electrical signals, the delay line further including a plurality of transducer taps disposed in an interaction region of the major surface, each providing a plurality of sensed electrical signals in response to surface acoustic waves impinging thereon in the interaction region, the sensed signals including electrical signals at the frequency of each of said acoustic waves, a plurality of nonlinear frequency mixer means, each responsive to the second electrical signals from a corresponding one of the transducer taps for providing signal manifestations of the sum and difference frequency of the surface acoustic waves impinging on the tap, and summing means, responsive to the signal manifestations from each of said nonlinear frequency mixer means, for providing a summation thereof, wherein the improvement comprises:

said plurality of nonlinear mixer means each including a nonlinear transfer characteristic in each of two quadrants displaced by one hundred eighty degrees, each of said plurality of nonlinear mixer means providing the signal manifestations of the sum and difference frequency in either of said quadrants, alternatively.

8. The improved apparatus of claim 7, further comprising:

a programmable voltage source for providing a plurality of bias signals to said nonlinear frequency mixers, one for each of said nonlinear frequency mixers, each bias signal being provided in a selected one of a first polarity, or a second polarity opposite to said first polarity, alternatively; and wherein each of said nonlinear frequency mixers is selectably operable in either one of said two quadrants in dependence on the polarity of said bias signal applied thereto.

9. The improved apparatus of claim 8, wherein:

said programmable voltage source provides each nonlinear frequency mixer with said bias signal through a pair of signal lines; and wherein each of said nonlinear frequency mixers includes a pair of semiconductor diodes connected between said pair of signal lines in an opposite sense, parallel arrangement wherein the cathode of a first diode is electrically common with the anode of a second diode, to provide said nonlinear signal transfer characteristic in each of said two quadrants which are displaced by 180°.

* * * * *

UNITED STATES PATENT AND TRADEMARK OFFICE
CERTIFICATE OF CORRECTION

PATENT NO. : 4,070,638
DATED : January 24, 1978
INVENTOR(S) : Thomas Macklin Reeder It is certified that error appears in the above-identified patent and that said Letters Patent are hereby corrected as shown below:

Column 4, line 15 "sin X/X" should be -- $\frac{\sin X}{X}$ --.

Column 4, line 20 "sin X/X" should be -- $\frac{\sin X}{X}$ --.

Column 5, line 30 "sin X/X" should be -- $\frac{\sin X}{X}$ --.

Column 6, line 42, "64-65" should be --63-65--.

Column 6, line 67, after "by" insert --the--.

Column 9, line 23 in the formula, "$F_1$" should be --$F_I$--.

Column 9, line 36 "[$f_m = (f_1 + f_2/2$]" should be --$f_m = \frac{f_1 + f_2}{2}$--.

Column 13, line 20 "sin X/X" should be -- $\frac{\sin X}{X}$ --.

Column 13, line 23 "sin X/X" should be -- $\frac{\sin X}{X}$ --.

Column 13, line 26 "sin X/X" should be -- $\frac{\sin X}{X}$ --.

UNITED STATES PATENT AND TRADEMARK OFFICE
CERTIFICATE OF CORRECTION

PATENT NO. : 4,070,638
DATED : January 24, 1978
INVENTOR(S) : Thomas Macklin Reeder It is certified that error appears in the above-identified patent and that said Letters Patent are hereby corrected as shown below:

Column 13, line 33 "sin X/X" should be -- $\frac{\sin X}{X}$ --.

Column 13, line 52 "sin X/X" should be -- $\frac{\sin X}{X}$ --.

Column 14, line 9 "sin X/X" should be -- $\frac{\sin X}{X}$ --.

Column 14, line 11 "sin X/X" should be -- $\frac{\sin X}{X}$ --.

Column 14, line 26 "sin X/X" should be -- $\frac{\sin X}{X}$ --.

Column 14, line 34 "sin X/X" should be -- $\frac{\sin X}{X}$ --.

Column 14, line 40 "sin X/X" should be -- $\frac{\sin X}{X}$ --.

Column 14, line 49 "sin X/X" should be -- $\frac{\sin X}{X}$ --.

Column 17, line 2, delete "second" and insert --sensed--.

UNITED STATES PATENT AND TRADEMARK OFFICE
CERTIFICATE OF CORRECTION

PATENT NO. : 4,070,638                                Page 3 of 3
DATED      : January 24, 1978
INVENTOR(S): Thomas Macklin Reeder It is certified that error appears in the above-identified patent and that said Letters Patent are hereby corrected as shown below:

Column 17, line 12, after "nonlinear", insert -- signal --.

Signed and Sealed this

Twenty-second Day of August 1978

[SEAL]

Attest:

RUTH C. MASON
Attesting Officer

DONALD W. BANNER
Commissioner of Patents and Trademarks